United States Patent
Rogla Madrid et al.

(10) Patent No.: US 10,248,741 B2
(45) Date of Patent: Apr. 2, 2019

(54) METHOD FOR EQUALIZING THE DISTORTION CAUSED BY LOSSES IN COUPLINGS IN A MICROWAVE FILTER AND A FILTER PRODUCED WITH SAID METHOD

(71) Applicant: THALES, Neuilly-sur-Seine (FR)

(72) Inventors: Luis Javier Rogla Madrid, Tres Cantos (ES); Maria Teresa Sancho Ruiz De Castaneda, Leganes Madrid (ES); Juan Sebastian Galaz Villasante, Tres Cantos (ES); Petronilo Martin Iglesias, Tres Cantos (ES); Antonio Pablo Del Pino Juarez, Tres Cantos (ES)

(73) Assignee: THALES, Courbevoie (FR)

(*) Notice: Subject to any disclaimer, the term of this patent is extended or adjusted under 35 U.S.C. 154(b) by 960 days.

(21) Appl. No.: 14/334,351

(22) Filed: Jul. 17, 2014

(65) Prior Publication Data
US 2015/0025862 A1    Jan. 22, 2015

(30) Foreign Application Priority Data
Jul. 19, 2013 (EP) .................................... 13290170

(51) Int. Cl.
*G06F 17/50* (2006.01)
*H01P 1/20* (2006.01)

(52) U.S. Cl.
CPC ............... *G06F 17/50* (2013.01); *H01P 1/20* (2013.01)

(58) Field of Classification Search
CPC .................................. G06F 17/50; H01P 1/20
(Continued)

(56) References Cited

U.S. PATENT DOCUMENTS

| 3,969,692 A | * | 7/1976 | Williams | ................ H01P 1/208 333/212 |
| 6,825,741 B2 | * | 11/2004 | Chappell | ................ H01P 1/203 333/202 |

(Continued)

OTHER PUBLICATIONS

Meng Meng, et al., "The Design of Parallel Connected Filter Networks with Nonuniform Q Resonators", IEEE Transactions on Microwave Theory and Techniques, Jan. 1, 2013, pp. 372-381, vol. 61, No. 1, IEEE Service Center, Piscataway, NJ, USA, XP011488020.

(Continued)

*Primary Examiner* — S. Sough
*Assistant Examiner* — Kimberly L Jordan
(74) *Attorney, Agent, or Firm* — Baker and Hostetler LLP

(57) ABSTRACT

A method for equalizing the distortion caused by losses in couplings in a microwave filter comprising the steps of: designing an initial transfer function of a filter; calculating the poles $p_i$ of said designed transfer function; modifying the values of said poles $p_i$ with a predetermined amount $a_i$, so as to produce an asymmetric displacement of the poles along the real axis of the complex plane, said predetermined amount $a_i$ being calculated as a function of a quality factor $Q_k$ of couplings between resonators that said microwave filter is made of; and calculating a modified transfer function from said initial transfer function and said modified poles $p_i$-$a_i$.

12 Claims, 3 Drawing Sheets

(58) Field of Classification Search
USPC .............................................................. 703/2
See application file for complete search history.

(56) References Cited

U.S. PATENT DOCUMENTS

| | | | |
|---|---|---|---|
| 6,882,251 B2 | 4/2005 | Yu et al. | |
| 2004/0108920 A1* | 6/2004 | Yu | ............................ H01P 1/20 333/203 |
| 2004/0233013 A1* | 11/2004 | Hashimoto | ......... H01P 1/20381 333/99 S |

OTHER PUBLICATIONS

Dominic Deslandes, et al., "General Formulation for Modeling Bandpass Filters with Finite Quality Factors and Resistive Couplings", Proceedings of the 38th European Microwave Conference, Oct. 27, 2008, pp. 1042-1045, IEEE, Piscataway, NJ, USA, XP031407342.

Ming Yu, et al., "Predistortion Technique for Cross-Coupled Filters and Its Application to Satellite Communications Systems", IEEE Transactions on Microwave Theory and Techniques, Dec. 1, 2003, pp. 2505-2515, vol. 51, No. 12, IEEE Service Center, Piscataway, NJ, USA, XP011105015.

E.G. Fubini, et al., "MinimumInsertion Loss Filters", Proceedings of the IRE, Jan. 1959, pp. 37-41.

Richard J. Cameron, et al., Microwave Filters for Communications Systems: Fundamentals, Design and Applications, 2007, pp. 230-239, Wiley Interscience.

* cited by examiner

METHOD FOR EQUALIZING THE DISTORTION CAUSED BY LOSSES IN COUPLINGS IN A MICROWAVE FILTER AND A FILTER PRODUCED WITH SAID METHOD

CROSS-REFERENCE TO RELATED APPLICATION

This application claims priority to foreign European patent application No. EP 13290170.3, filed on Jul. 19, 2013, the disclosure of which is incorporated by reference in its entirety.

FIELD OF THE INVENTION

The invention relates to the field of microwave filters based on the use of coupled resonators, and more specifically concerns a method for equalizing the distortion caused by losses in couplings in a microwave filter and a filter produced with such a method In particular, the invention applies to filters used in IMUX (Input Multiplexer) channel filters for satellite communications or in any RF communication system requiring filters with precise equalization of the bandpass transfer function.

BACKGROUND

The insertion loss flatness of coupled resonator microwave bandpass filters is affected by an undesired slope. This undesired slope is due to the presence of dissipative losses which occur at the couplings between adjacent resonators. It can lead to a non compliance of the targeted filter specifications, in particular at low frequencies.

Therefore, there is a need for a method for equalizing the distortion due to this phenomenon in order to minimize the slope of filters in their bandpass.

It is known from the prior art, in particular in references [1],[2] and [3], methods for pre-distortion of a filter transfer function which are intended to compensate for the rounding that occurs at both edges of the filter pass band due to the dissipation in the filter cavities.

However these techniques only consider the unloaded quality factor of resonators, in other words the quality factor of isolated resonators, but do not take into account the effect of the finite quality factor of pure reactive elements, i.e. inductive or capacitive couplings between adjacent resonators due to losses in these elements.

It is also know from reference [5] the use of the quality factor of couplings between resonators to calculate the normalized impedance of a resonator filter. However, reference [5] does not teach that the quality factor of couplings can be used to pre-distort the transfer function of a filter in order to equalize and correct the insertion loss variation of the filter.

Therefore, there is a need for a method for equalizing insertion loss variations in a filter transfer function and compensating the effect of losses in couplings between adjacent resonators used for implementing the filter.

A goal of the invention is to provide a deterministic method for equalizing insertion loss variations in a filter transfer function. The filter electrical parameters are modified in order to equalize the insertion loss slope due to dissipative couplings, while maintaining selectivity and group delay characteristics.

SUMMARY OF THE INVENTION

It is proposed, according to one aspect of the invention a method for equalizing the distortion caused by losses in couplings in a microwave filter comprising the steps of:

Designing an initial transfer function of a filter,

Calculating the poles $p_i$ of said designed transfer function,

Modifying the values of said poles $p_i$ with a predetermined amount $a_i$, so as to produce an asymmetric displacement of the poles along the real axis of the complex plane, said predetermined amount $a_i$ being calculated as a function of a quality factor $Q_k$ of couplings between resonators that said microwave filter is made of, Calculating a modified transfer function from said initial transfer function and said modified poles $p_i-a_i$.

According to an aspect of the invention, said predetermined amount $a_i$ respectively increases or decreases with the respective increase or decrease of the imaginary part of the poles $p_i$.

According to another aspect of the invention, said predetermined amount $a_i$ is calculated so as to shift away the modified poles $p_i-a_i$ from the imaginary axis.

According to another aspect of the invention, said predetermined amount $a_i$ is equal to $a_i=C(1-i)/Q_k$, with i being the index of a pole $p_i$ along the imaginary axis of the complex plane and C being a constant.

According to another aspect of the invention, said quality factor $Q_k$ of couplings is calculated as the ratio between the maximum stored energy at the couplings between resonators of said microwave filter and the energy loss per unit time.

According to another aspect of the invention, said microwave filter is an IMUX channel filter for satellite communications.

It is also proposed, according to another aspect of the invention, a computer program product, comprising computer-executable instructions for executing the method for equalizing the distortion caused by losses in couplings in a microwave filter according to the invention, when said computer program is executed on a processor and a microwave filter obtained by the execution of said method.

BRIEF DESCRIPTION OF THE DRAWINGS

The invention will be better understood with the study of some embodiments described by way of non-limiting examples and illustrated by the accompanying drawings wherein.

DETAILED DESCRIPTION

Figure 1:
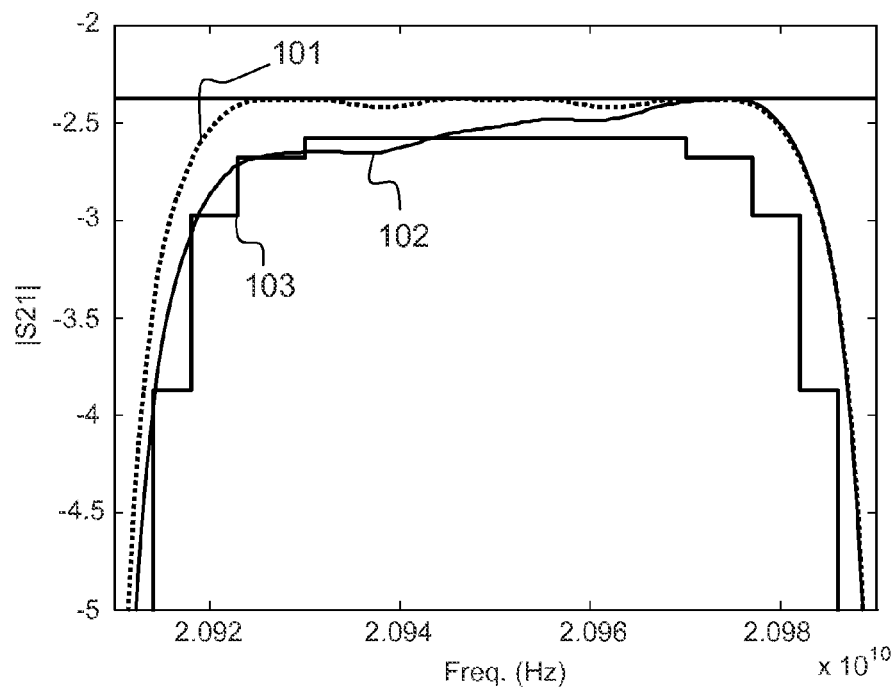
FIG. 1 illustrates, on a diagram amplitude/frequency, the insertion loss of a filter which transfer function is designed according to usual methods compared to the desired insertion loss specification.

The following figures explain more in details the functioning of the present invention.

The present invention is applicable to any band-pass filter which transfer function is obtained through the use of standard synthesis techniques. An example of a filter synthesis technique is given in reference [4] based on the use of the generalized Chebyshev filter response.

The first step of a filter synthesis process is the calculation of the filter transfer function.

A filter transfer function can be described as a set of three closely related rational functions $S_{21}(s)$, $S_{11}(s)$ and $S_{22}(s)$:

$$H(s) = S_{21}(s) = \frac{P(s)}{E(s)}; S_{11}(s) = \frac{F1(s)}{E(s)}; S_{22}(s) = \frac{F2(s)}{E(s)};$$

in which $E(s)$, $P(s)$, $F1(s)$ and $F2(s)$ are polynomials in the complex variable s, which is, in general, of the form $s=\sigma+j\omega$, with $\sigma$ and $\omega$ the real and imaginary parts, respectively.

Degree N of polynomials E, F1 and F2 is the order of the filter which is also equal to the number of cavities of the microwave filter. Degree of polynomial P can be any value between 0 and N. The "poles" $p_1, p_2, \ldots p_n$ of the transfer function are the roots of the denominator polynomial E. The poles are complex values.

$$E(s)=c(s-p_1)(s-p_2) \ldots (s-p_n)$$

The roots of the numerator polynomial P, which are known as "transmission zeros", determine very important transmission characteristics of the filter, mainly insertion loss variation (ILV), selectivity and group delay (GD). In the generalized Chebyshev responses, the roots of polynomials F1 and F2, also known as "reflection zeros", are restricted to lay in the imaginary axis of the complex frequency plane, in a way such that the maximum magnitude of the reflection coefficients $S_{11}$ and $S_{22}$ occurs at (N-1) frequency points in the filter useful bandwidth BW with the same constant value RL.

The values of the transmission zeros—roots of P—along with N (filter order), Fc (filter center frequency), BW (filter bandwidth) and RL (minimum constant ripple return losses) can be chosen by the filter designer, without any restriction, at the very beginning of the synthesis process.

By means of a well established mathematical procedure as described in [4], the transfer functions $S_{21}$, $S_{11}$ and $S_{22}$ are afterwards obtained, and most importantly, their graphical representation, by means of which the filter designer can check that the calculated theoretical responses meet the required specifications.

The value of the roughly uniform dissipative losses at each filter cavity, represented by the unloaded quality factor $Q_u$, which is mainly dependent of the filter technology and cavity size, is usually known and also taken into account at this stage.

The final step in the synthesis process is to obtain the values of the filter parameters, usually in the form of a coupling matrix (i.e. a matrix which contains the values of inter-cavity coupling coefficients, external coupling factors and cavity resonant frequencies). This coupling matrix is directly obtained from the rational functions $S_{21}$, $S_{11}$ and $S_{22}$.

FIG. 1 illustrates, on a diagram amplitude/frequency, the insertion loss variations, in the filter bandwidth, in case of ideal couplings 101, considering only resonator loss $Q_u$, and in a realistic case 102 in which the effect of dissipative couplings $Q_k$ between the cavities within the filter is taken in account. A desired specification 103 is also represented showing that the undesired slope of the insertion loss 102 can lead to a non respect of the filter specification 103 in particular at low frequencies.

The effect of loss in couplings is very noticeable in filters with equalized group delay and dielectric resonator technology.

FIG. 2 illustrates again the same effect due to dissipative couplings but this time on the poles of the filter transfer function. For illustrative purposes, a particular example of a ten poles channel filter response is given.

Figure 2:
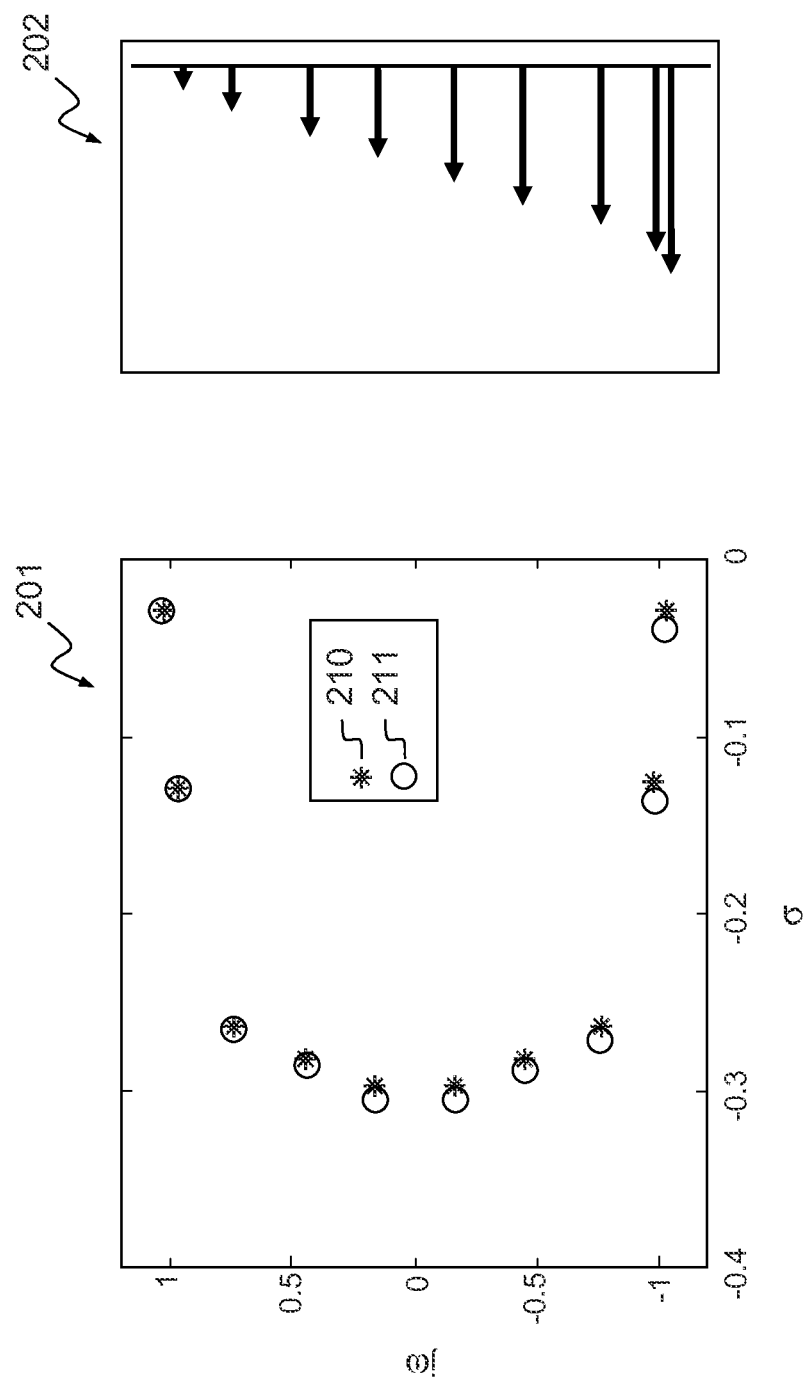
FIG. 2 illustrates, on two diagrams, the transfer function poles of a filter in case of ideal couplings between resonators and in case of lossy couplings between resonators.

Diagram 201 illustrates the complex values of the poles in the complex plane respectively for a filter with ideal couplings 210 and a filter with dissipative couplings 211. In the example of FIG. 2, the theoretical desired response 210 is symmetric with respect of the transfer function poles whereas the real response 211 shows an asymmetric displacement of the poles due to lossy couplings. The asymmetric displacement is responsible for the distortion of the insertion loss response shown on FIG. 1 which is also asymmetric with respect to the filter center frequency. There is a close relationship between the asymmetric displacement of the poles shown on FIG. 2 and the asymmetric deformation of the insertion loss shown on FIG. 1. On diagram 202 of FIG. 2 is shown an illustrative representation of the displacement values of each poles compared to the ideal filter response. It can be seen that the displacement value increases with frequency decreasing or equivalently with imaginary part of the poles decreasing.

In order to compensate for insertion loss distortion illustrated on FIG. 1 and FIG. 2, the present invention proposes a deterministic method of equalization which aims at compensating the insertion loss distortion through the compensation of the filter transfer function poles displacement.

Each pole of the synthesized filter transfer function must be displaced to an amount configured to compensate for their asymmetric displacement.

Figure 3:
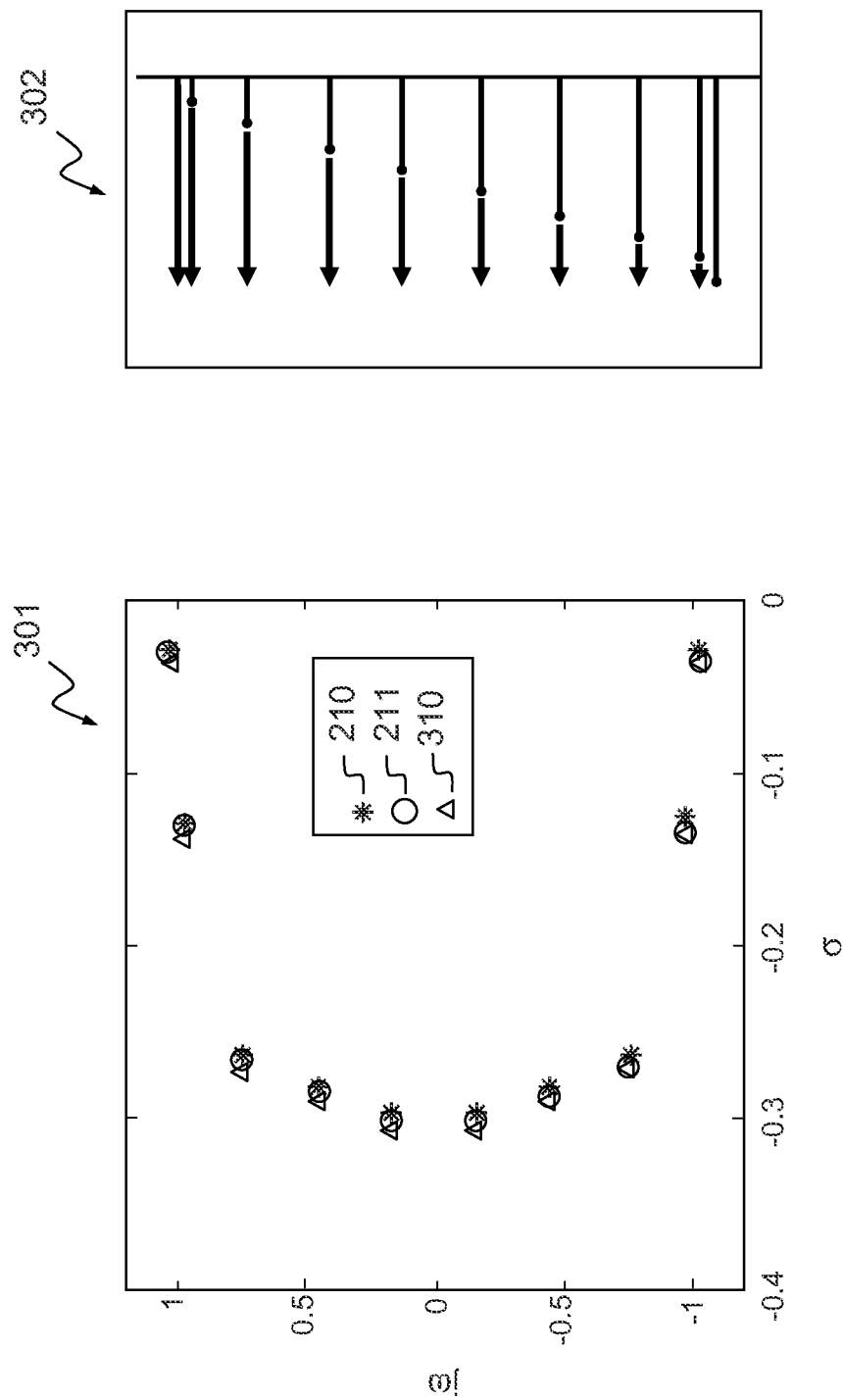
FIG. 3 illustrates, on the same diagrams as FIG. 2, the effect of the method of equalization according to the invention on the resulting transfer function poles of an equalized filter.

This principle is illustrated on FIG. 3 showing, on the same diagrams as FIG. 2, the equalized transfer function poles 310 (on diagram 301) and the corresponding displacement operated (on diagram 302) to the original poles in order to obtain a transfer function as close as possible to the ideal transfer function and to reintroduce symmetry in the filter transfer function.

Figure 4:
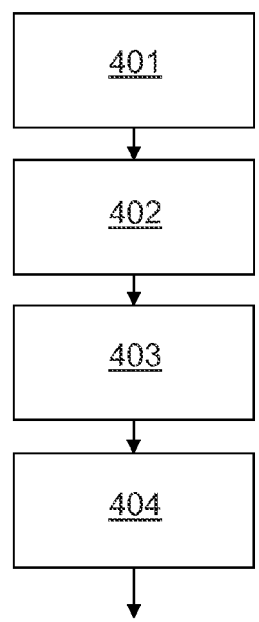
FIG. 4 illustrates a flow chart of the steps of the method of equalization according to the invention.

The steps of the method of equalization according to the invention are now described in detail according to the flow chart depicted on FIG. 4.

In a first step 401, the transfer function of the desired filter is designed according to required specifications. For example, the design of a filter transfer function can be implemented via the technique previously described with reference to document [4] and lead to the design of rational functions $S_{21}(s)$, $S_{11}(s)$ and $S_{22}(s)$.

In a second step 402, the poles $p_i$ of the filter transfer function are calculated.

In a third step 403, the values of the poles $p_i$ of the filter are modified with a predetermined amount so as to operate a displacement of the poles along the real axis in the complex plane in an asymmetric way.

In a particular embodiment of the invention, the asymmetrical displacement of the poles is operated so that the predetermined amount added to the real part of each pole increases or decreases with the increase or decrease of the imaginary part of the poles. Therefore, the poles are either shifted away from the imaginary axis or shifted closer to the imaginary axis.

An advantage of shifting the poles away from the imaginary axis is that the system becomes more stable.

In another particular embodiment of the invention, the displacement of the poles is operated so that the poles with the highest imaginary part are modified with a larger displacement than the poles with the smallest imaginary part. The smallest imaginary part correspond to the lowest frequencies whereas the highest imaginary part correspond to the highest frequencies, in other words, the displacement of the poles is operated so that the poles corresponding to the highest frequencies are modified with a larger displacement than the poles corresponding to the lowest frequencies.

In all embodiments of the invention the predetermined amount used for displacing the poles depends on the quality factor $Q_k$ of the couplings between the resonators of the filter. This quality factor is different from the unloaded quality factor $Q_u$ which only depend on the filter technology and the cavity size. Besides the unloaded quality factor $Q_u$ is related with losses of a resonator whereas the quality factor $Q_k$ of couplings is related with losses of the reactive non-resonant element used for coupling.

In a particular embodiment, the poles $p_i$ are displaced with an amount $a_i=f(Q_k)=C\cdot(1-i)/Q_k$ with i an integer taken between 0 and N−1, N being the number of poles and C being a proportionality constant.

The couplings quality factor $Q_k$ can be obtained from material estimations, simulations, measurements or any other equivalent mean.

The quality factor of a filter may be defined as the ratio of stored versus lost energy per unit of time. As the energy dissipated in couplings is generally small the effect of the quality factor of inductive or capacitive couplings $Q_k$ is usually neglected and only the unloaded quality factor of resonators $Q_u$ (that of an isolated resonator) is taken into account. Thus, the quality factor $Q_k$ of reactive elements such as couplings can be formulated as the ratio between the maximum stored energy at the couplings and the energy loss per unit time.

$$Q(\omega) = \omega \times \frac{\text{Maximum\_energy\_stored}}{\text{Energy\_loss}}$$

with ω is the angular frequency at which the stored energy and energy loss are measured. In practice the quality factor $Q_k$ of couplings is determined in a similar way than the quality factor of resonators $Q_u$, i.e. from filter measurements or approximations based on materials and geometries of the elements used for coupling.

The displacement of poles operated in step 403 is performed once and does not require any iteration.

Finally, in a last step 404, a modified transfer function is calculated keeping the same values of transmission zeros than the initial transfer function designed at first step 401 but using the modified poles obtained at step 403.

Using again the technique described in reference [4], the modified transfer function can be calculated with the following formula:

$$H''(s) = S''_{21}(s) = \frac{P(s)}{E''(s)}$$

with P(s) the same polynomial used for initial transfer function H(s) and E"(s) the polynomial whose poles are the modified poles.

$$E''(s) = c[s-(p_1-a_1)]\cdot[s-(p_2-a_2)]\ldots[s-(p_n-a_n)]$$

Polynomials S21", S11" and S22" can then be calculated from H"(s), and will be different from the original S21, S11 and S22 obtained from H(s).

Finally the filter coupling matrix can also be calculated in the same way as for the original transfer function.

An advantage of the invention is to preserve the group delay and selectivity responses exhibited by the original filter. This feature is always important, especially in the case of input multiplexer channel filters, whose group delay and selectivity requirements are usually very stringent.

It is to be appreciated that the method according to the invention can be implemented in the form of an entirely hardware embodiment, an entirely software embodiment or an embodiment containing both hardware and software elements. In a preferred embodiment, the method according to the invention is implemented in software.

Furthermore, the method according to the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

REFERENCES

[1] Fubini "Minimum Insertion Loss Filters" Proceedings of the IRE January 1959
[2] Ming Yu "Predistortion Technique for Cross-Coupled Filters and Its Application to Satellite Communication Systems" IEEE TRANSACTIONS ON MICROWAVE THEORY AND TECHNIQUES, VOL. 51, NO. 12, DECEMBER 2003
[3] U.S. Pat. No. 6,882,251 B2
[4] R. J. Cameron, C. M. Kudsia, and R. R. Mansour, "*Microwave filters for communication systems: fundamentals, design, and applications,*" Wiley-Interscience, 2007.
[5] Deslandes D et al, "General Formulation for modeling bandpass filters with finite quality factors and resistive couplings", microwave conference, 2008. EUMC 2008. 38th European, IEEE, Piscataway, N.J., USA, 27 Oct. 2008

The invention claimed is:
1. A method for producing a microwave filter having an equalized transfer function, the method comprising the steps of:
 designing with a processor an initial transfer function of a microwave filter,
 calculating, with the processor, poles $p_i$ of said designed initial transfer function,
 modifying, with the processor, values of said poles $p_i$ with a predetermined amount $a_i$, so as to produce an asymmetric displacement of the poles along a real axis of a complex plane, said predetermined amount $a_i$ being calculated as a function of a quality factor $Q_k$ of couplings between adjacent resonators of the microwave filter so as to compensate for an effect of losses in couplings between adjacent resonators of the microwave filter,
 calculating with the processor a modified transfer function from said initial transfer function and said modified poles $p_i$-$a_i$, and producing a microwave filter comprising resonators from said modified transfer function.

2. The method according to claim 1 wherein said predetermined amount as respectively increases or decreases with a respective increase or decrease of an imaginary part of the poles $p_i$.

3. The method according to claim 1 wherein said predetermined amount $a_i$ is calculated so as to shift away the modified poles $p_i$-$a_i$ from an imaginary axis.

4. The method according to claim 1 wherein said predetermined amount $a_i$ is equal to $a_i=C(1-i)/Q_k$, with i being an index of a pole $p_i$ along an imaginary axis of the complex plane and C being a constant.

5. The method according to claim 1 wherein said quality factor $Q_k$ of couplings is calculated as a ratio between a maximum stored energy at the couplings between resonators of said microwave filter and an energy loss per unit time.

6. The method according to claim 1 wherein said microwave filter is an IMUX channel filter configured for satellite communications.

7. A microwave filter produced by an execution of a method for equalizing a distortion caused by losses in couplings between adjacent resonators in a microwave filter, the method comprising the steps of:
designing with a processor an initial transfer function of a filter,
calculating with the processor poles $p_i$ of said designed initial transfer function,
modifying with the processor values of said poles $p_i$ with a predetermined amount $a_i$, so as to produce an asymmetric displacement of the poles along a real axis of a complex plane, said predetermined amount as being calculated as a function of a quality factor $Q_k$ of couplings between adjacent resonators of the microwave filter so as to compensate for an effect of losses in couplings between adjacent resonators of the microwave filter,
calculating with the processor a modified transfer function from said initial transfer function and said modified poles $p_i$-$a_i$, and
producing a microwave filter comprising resonators from said modified transfer function.

8. A microwave filter according to claim 7 wherein said predetermined amount $a_i$ respectively increases or decreases with a respective increase or decrease of an imaginary part of the poles $p_i$.

9. A microwave filter according to claim 7 wherein said predetermined amount $a_i$ is calculated so as to shift away the modified poles $p_i$-$a_i$ from an imaginary axis.

10. A microwave filter according to claim 7 wherein said predetermined amount $a_i$ is equal to $a_i=C(1-i)/Q_k$, with i being an index of a pole $p_i$ along an imaginary axis of the complex plane and C being a constant.

11. A microwave filter according to claim 7 wherein said quality factor $Q_k$ of couplings is calculated as a ratio between a maximum stored energy at the couplings between resonators of said microwave filter and an energy loss per unit time.

12. A microwave filter according to claim 7 wherein said microwave filter is an IMUX channel filter configured for satellite communications.

* * * * *

UNITED STATES PATENT AND TRADEMARK OFFICE
CERTIFICATE OF CORRECTION

PATENT NO. : 10,248,741 B2
APPLICATION NO. : 14/334351
DATED : April 2, 2019
INVENTOR(S) : Luis Javier Rogla Madrid et al.

It is certified that error appears in the above-identified patent and that said Letters Patent is hereby corrected as shown below:

In the Claims

In Claim 7, Column 8, Line 1, "amount as being calculated" should be -- amount $a_i$ being calculated --.

Signed and Sealed this
Fourth Day of June, 2019

Andrei Iancu
*Director of the United States Patent and Trademark Office*